SEMI-CONDUCTOR RECTIFIERS

Filed June 1, 1954

INVENTOR.
Jerome Kurshan
BY J. L. Whittaker
ATTORNEY 2,940,024
Patented June 7, 1960

2,940,024

SEMI-CONDUCTOR RECTIFIERS

Jerome Kurshan, Princeton, N.J., assignor to Radio Corporation of America, a corporation of Delaware Filed June 1, 1954, Ser. No. 433,618
10 Claims. (Cl. 317—236)

This invention relates to improved semi-conductor devices and more particularly to improved crystal rectifiers useful at relatively high frequencies.

Previous crystal rectifiers useful at ultra high frequencies such as several hundred megacycles per second and higher are relatively fragile electrically and tend to burn out easily when subjected to fields of relatively high strength. Previous devices generally utilize crystal material of relatively low resistivity and exhibit a relatively high and often disadvantageous back current characteristic.

Accordingly, one object of the instant invention is to provide improved semi-conductor rectifier devices.

Another object is to provide improved semi-conductor devices especially adapted for operation at relatively high electrical frequencies.

These and other objects are accomplished by the instant invention which provides crystal rectifiers especially adapted for highly frequency operation and having desirable electrical ruggedness. In particular, the invention provides devices utilizing crystalline semi-conductive materials of relatively high resistivity and in which the average effective lifetimes of minority charge carriers are maintained at relatively low values. A typical device according to the invention utilizes a semi-conductor wafer having a resistivity of about 0.1 to 1.0 ohm-cm. and a minority carrier lifetime characteristic of less than 0.1 microsecond. In the region adjacent to the rectifying electrode the wafer is thinner than the diameter of the contact area between the electrode and the wafer.

The resistivity of the wafer is selected at an optimum value to maximize the reverse breakdown voltage and to minimize the reverse saturation current of the device without unduly increasing the internal resistance of the device. The minority carrier lifetime is selected at an optimum value to minimize the minority carrier storage effect without undesirably increasing the reverse saturation current of the device. The thickness of the wafer is selected at an optimum value to minimize the internal resistance of the device without decreasing its back direction breakdown voltage below a minimum desired value.

Figure 1:
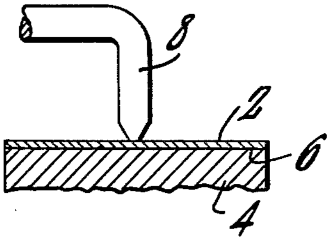
Figure 2:
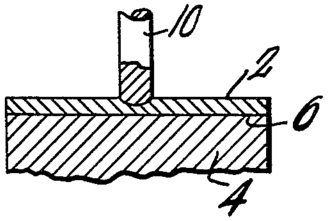
Figure 3:
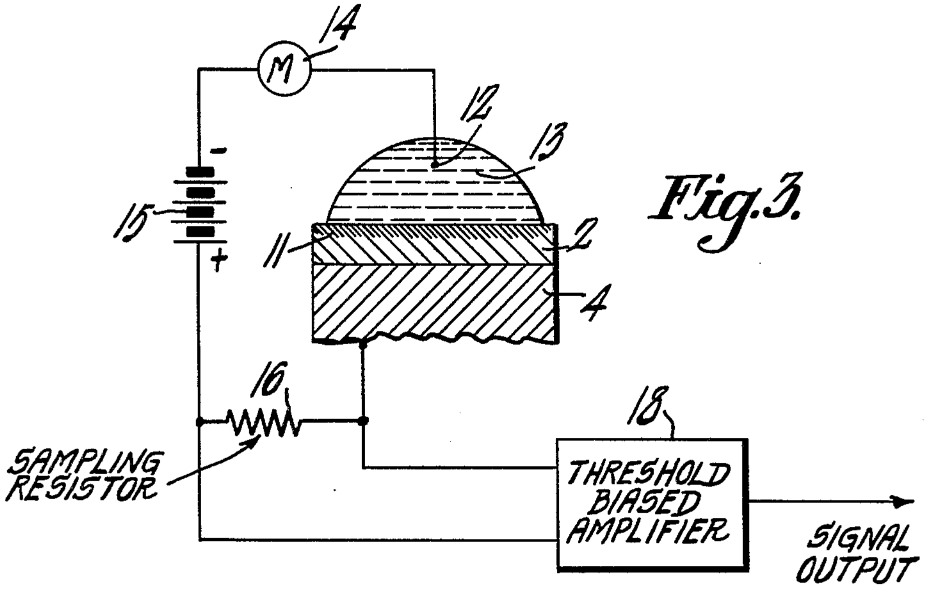

The invention will be described in greater detail in connection with the accompanying drawing of which:

Figures 1 and 2 are greatly enlarged, schematic, cross-sectional, elevational views of two respective embodiments of the instant invention; and Figure 3 is a schematic, cross-sectional, elevational view illustrating a method of controllably etching a semi-conductor wafer to reduce its thickness.

Similar reference numerals are applied to similar elements throughout the drawing.

The improved devices according to the instant invention utilize specially prepared semi-conductive materials, improved structural features and improved methods of manufacture. In particular, the semi-conductive material is prepared so that minority charge carriers injected into it recombine relatively quickly with the majority charge carriers, preferably within about 0.1 microsecond or less of their creation. In structure the devices include bodies of semi-conductive material having relatively thin regions.

One embodiment of the invention comprises a point contact crystal rectifier as shown in Figure 1. This device comprises a base wafer 2 of a semi-conductive material such as n-type germanium having a resistivity of about 0.1 ohm-cm. The wafer is mounted on a conductive support 4 by means of a substantially non-rectifying solder connection 6. A point contact probe 8 is pressed on the surface of the wafer opposite the support. According to the invention, the wafer preferably comprises a single crystal of semi-conductive material having a relatively high resistivity of about 0.1 to 1.0 ohm-cm., and is prepared so that minority charge carriers exist in the material for only a relatively short average time, such as about 0.1 microsecond or less, before combining with majority charge carriers and disappearing. The combination of these two properties, high resistivity and short minority carrier lifetime, may be provided in semi-conductive germanium and silicon by one or more of the following methods.

*Method I.—Double doping of melt*

In the preparation of high resistivity germanium or silicon by freezing an ingot from a melt of the material the effective lifetime of the minority carriers in the material may be effectively reduced without reducing the resistivity below a desired value. One method of doing this comprises doping the melt with two opposite type conductivity-determining impurities. An ingot grown from such a melt may exhibit a relatively high resistivity even though it includes relatively large proportions of impurities. Since the impurities are of opposite conductivity-types their effect in reducing the resistivity of the ingot is minimized because the one balances the other. The conductivity type of the ingot is primarily determined by the impurity material included in the ingot in the larger amount. The effect of the relatively large concentration of total impurities in the ingot is to provide traps, or recombination centers in the ingot which facilitate the recombination process.

*Method II.—Neutral doping of melt*

A similar effect may be provided by an ingot containing neutral type impurities. In germanium and silicon, for example, impurities such as tin and lead, in quantities sufficiently small so that the single crystal structure is not destroyed, do not substantially affect either the resistivity or the conductivity-types of the materials. These impurities, however, do provide recombination centers and thus serve effectively to lower the lifetimes of the minority carriers.

*Method III.—Slow cooling of ingot*

A third method of decreasing the average lifetime of minority carriers in an ingot of semi-conductive germanium is to heat the ingot to a temperature above 500° C. and to cool it slowly to room temperature at a rate of about one degree per minute or slower. While quenching tends to affect the resisitivity of germanium, slow cooling has been found to lower the carrier lifetime without correspondingly decreasing the resistivity.

The base wafers of such devices according to the invention have an effective average lifetime of the order of about 0.1 microsecond.

*Wafer thickness considerations*

The electrical properties of crystal rectifiers at high frequencies may be further enhanced by reducing the thickness of the crystal base at least to about the same order of magnitude as the diameter of the rectifying contact. If the rectifying contact consists of a wire sharpened to a point at one end and held against the crystal by pressure, the contact area may be about .0001" in diameter. In this case the thickness of the crystal may be reduced to about .0001" by etching it electrolytically according to the method hereinafter described. If the rectifying contact is constituted by a wire welded to the wafer, its contact area may be about .001" to .005" in diameter or more. In this case the etching to correct thickness is not critical and may be accomplished by other known methods.

The critical thickness of the crystal wafer is the thickness measured from the rectifying barrier to the wafer surface opposite the barrier-forming electrode. In the pressure-contact type of device the critical thickness is the entire thickness of the wafer at the point of contact. In the welded-contact devices, however, the electrodes form barriers relatively deep in the wafers, and the critical thickness, therefore, is substantially less than the entire thickness of the wafers.

According to the invention the critical thickness is made as small as possible, consistent with a desired back-direction breakdown voltage. Improved results are provided when the critical thickness is not appreciably greater than the diameter of the contact area of the rectifying electrode. In welded-contact devices the critical thickness may be made substantially less than the contact diameter because the contact diameter is relatively large with respect to the thickness required for satisfactory back-voltage breakdown characteristics. The total wafer thickness of these devices, however, is preferably of about the same order of magnitude as the contact diameter since the welding operation forms a barrier relatively deep in the wafer, at a depth approximating the contact radius.

A preferred embodiment of a rectifier device according to the invention may be prepared as follows:

A quantity of relatively pure germanium having a resistivity of about 10 ohm-cm. or more is melted in a carbon crucible in a non-oxidizing atmosphere. The melt is doped by adding a quantity of antimony sufficient to establish an antimony concentration of about $2\times10^{-4}$ mol fraction in the melt, and a quantity of nickel to establish a nickel concentration of about $10^{-2}$ mol fraction. A single crystal seed is contacted to the surface of the melt and slowly withdrawn as the material of the melt freezes upon it to form an elongated single crystal structure, the orientation of which is determined by the seed. A single crystal thus grown includes antimony and nickel impurities which tend to provide mutually opposite type conductivities in the crystal. These impurities balance each other so that only the net excess of the one over the other is primarily effective to determine the conductivity-type and the resistivity of the grown crystal.

The quantities of the impurities included in the initially grown portions of the crystal are determined not only by the quantities of the impurities present in the melt but also by the segregation phenomenon. The segregation phenomenon may be expressed quantitatively in terms of a factor called the segregation coefficient. The segregation coefficient, $k$, of a material in germanium, for example, may be defined as the ratio of the concentration of the material at the solid side of the interface between a growing crystal and a melt of germanium and the concentration of the material on the liquid side of the interface. ($k$=concentration in solid÷concentration in liquid.) In the instant case the segregation coefficient of antimony in germanium is about $5\times10^{-3}$ and the segregation coefficient of nickel in germanium is about $10^{-5}$. Based on the concentrations of nickel and antimony established in the melt, therefore, the initially grown portion of the crystal includes about ten times as much antimony as nickel. The crystal includes about one antimony atom for each million germanium atoms and about one nickel atom for each ten million germanium atoms. The nickel atoms cancel and balance one-tenth of the antimony atoms, thus reducing the conductivity-affecting impurity concentration from about $1\times10^{-6}$ to about $0.9\times10^{-6}$. The resistivity of the resultant crystal is about 0.1 ohm-cm. at room temperature.

Nickel is a preferred p-type impurity for doping germanium according to the invention. When dispersed in germanium it provides relatively complex acceptor impurity centers which enhance recombination of minority charge carriers. Any known n-type impurity may be utilized in combination with nickel to produce double-doped germanium for devices of the invention.

Referring now to Figure 3, a wafer 2 about 1 mm. square and ½ mm. thick is cut from the initially grown portion of the crystal. It is ground to reduce its thickness to about .010" and is soldered to a nickel support 4. The soldering may conveniently be accomplished by any known technique utilizing a soft solder such as 49% tin–49% lead–2% antimony and a flux such as a 25% ammonium chloride–zinc chloride solution. The wafer is etched with a solution of by volume 4 parts hydrofluoric acid, 4 parts nitric acid and 1 part water to reduce its thickness to about .005". Care is exercised in this step to expose only one surface of the wafer to the etchant in order not to destroy the solder connection or to dissolve the nickel support.

*Electrolytic etching*

The wafer is then etched electrolytically to reduce its thickness to a final predetermined value which in the case of a pressure contact device is about .0005" to .00005". This etching may be accomplished according to the method described and claimed in the copending application of J. Kurshan, Serial No. 434,945, filed concurrently herewith, now abandoned, and as shown in Figure 3. The critical surface only of the wafer is exposed to an electrolyte such as a 0.1 normal sodium hydroxide solution. A drop 13 of the solution may be placed upon the surface, as illustrated or, alternatively, the wafer may be masked and immersed in a relatively large quantity of the electrolyte. An electrolyzing electrode 12 is placed in contact with the electrolyte. A potential from a D.-C. source 15 approximately equal to or slightly greater than the maximum back-direction breakdown voltage desired in the completed device is applied between the wafer and the electrolyzing electrode. A current measuring device 14 such as a galvanometer or a milliammeter is connected in the circuit between the electrolyzing electrode and the wafer. The etching potential is maintained until a sudden, relatively rapid increase in current is noted. A sudden increase in etching current indicates that the etching has reduced the thickness of the wafer to the desired value.

*Automatic electrolytic etching control*

An automatic signal may be provided to indicate the increased current. For example, a sampling resistor 16 of about 1000 ohms may be included in the etching circuit. The voltage developed across this resistor by the etching current may be impressed upon the input of a threshold-biased amplifier 18 so that when the etching current increases above a predetermined value a signal is provided at the amplifier output. The signal may be utilized to actuate a relay or other equipment (not shown) automatically to stop the etching.

The bias required at the amplifier input is dependent upon factors such as the etching potential and the resistivity and thickness of the semi-conductor wafer. Generally, however, a bias of a few volts is selected to maintain the amplifier in a cut-off condition during the preliminary etching, and to provide a signal when the sudden increase in etching current occurs. For a specific example, when etching the 0.1 ohm-cm., 1 mm. square wafer heretofore described at a voltage of about 5 volts, a threshold bias of about 3–4 volts provides satisfactory operation of the amplifier.

The control of the electrolytic etching process is effected by the electrical effect of the electrolyzing potential upon the wafer. A major portion of the electrolyzing potential appears across a barrier region 11, or layer in the wafer adjacent to the surface in contact with the electrolyte. The barrier region is indicated schematically in Figure 3 by cross-hatching. The thickness of the barrier region is determined primarily by the magnitude of the potential and the resistivity of the wafer and may be readily controlled from about $1\mu$ to $50\mu$ by varying the potential. As long as the barrier layer thickness is less than the thickness of the wafer the current is principally limited by the rate of diffusion of electric charge carriers through that portion of the crystal beyond the barrier layer.

When the etching reduces the thickness of the wafer to approximately the thickness of the barrier layer the current no longer is limited by the diffusion process, but depends primarily upon space charge limitations in the barrier layer which permit a relatively large current flow. Since the edge of the barrier layer is relatively sharp and well defined, a relatively sharp and sudden increase in current occurs when the etching has removed sufficient material to reduce the thickness of the wafer to substantially the thickness of the barrier region.

It is preferred to utilize a relatively highly conductive electrolyte and an electrolyzing electrode of relatively large area with respect to the area of the wafer in order to minimize the electrical resistance in series with the barrier resistance and thereby to increase the sensitivity of the process.

The wafer is removed from the electrolyte, rinsed in distilled water and dried. It may be mounted in a cartridge and contacted by a point probe such as a .002″ to .008″ diameter tungsten wire, the contact end of which is sharpened to a point about .0005″ to .00005″ in diameter. The point pressure is adjusted according to known techniques and the cartridge is filled with an insulating medium such as wax and sealed.

The practice of the invention is, of course, applicable to devices other than the specific point contact rectifier described heretofore. For example, similar devices may be made utilizing predominantly p-type instead of predominantly n-type semi-conductive germanium, and other semi-conductive materials such as silicon, indium phosphide or aluminum antimonide may be utilized instead of germanium.

When electrolytically etching to reduce the thickness of a p-type semi-conductive crystal, however, the connection between the crystal and its mount must be a rectifying connection. An etching potential biases a p-type crystal in the forward direction with respect to the electrolyte and a barrier, therefore, must be provided at the interface between the crystal and its mount. When such a device is completed the rectifying effect of the mount connection is negligible because the point or welded contact is of much smaller area than the mount connection.

Improved welded contact type rectifiers may also be made in accordance with the instant invention. Such a typical welded contact device is illustrated in Figure 2 and may be made by contacting a .002″ diameter wire 10 of an alloy of platinum or ruthenium, for example, to the surface of a .002″ thick wafer 2 and welding the wire to the wafer by passing a current of several amperes in the forward direction through the wire and wafer for about one second.

There have thus been described improved semi-conductor devices and methods of making them, which devices are particularly adapted for operation as high frequency rectifiers.

What is claimed is:

1. A semi-conductor device comprising a body of a semi-conductive material, an electrode in non-rectifying contact with said body and a point electrode in rectifying contact with said body, said material having a resistivity of 0.1 to 1.0 ohm-cm., the average effective lifetime of minority charge carriers in said material being less than about 0.1 microsecond.

2. A semi-conductor device comprising a body of a semi-conductive material, an electrode in non-rectifying contact with said body and a point electrode in rectifying contact with said body, said material having a resistivity of 0.1 to 1.0 ohm-cm. and the thickness of said body in the region between said electrodes being less than the diameter of the contact area between said rectifying electrode and said body.

3. A semi-conductor device comprising a body of a semi-conductive material, an electrode in non-rectifying contact with said body and a point electrode in rectifying contact with said body, the average effective lifetime of minority charge carriers in said material being less than about 0.1 microsecond, and the thickness of said body in the region between said electrodes being no greater in order of magnitude than the diameter of the contact area between said rectifying electrode and said body.

4. A semi-conductor device comprising a body of a semi-conductive material, an electrode in non-rectifying contact with said body and a point electrode in rectifying contact with said body, said material having a resistivity of 0.1 to 1.0 ohm-cm., the average effective lifetime of minority charge carriers in said material being less than about 0.1 microsecond, and the thickness of said body in the region between said electrodes being no greater in order of magnitude than the diameter of the contact area between said rectifying electrode and said body.

5. A device according to claim 4 in which said semi-conductive material includes two mutually opposite conductivity type impurity materials, one of said impurity materials being present in sufficient excess over the other to control the conductivity type and the resistivity of said semi-conductive material.

6. A device according to claim 4 in which said semi-conductive material is germanium and includes two mutually opposite conductivity type impurity materials, one of said impurity materials being nickel.

7. A device according to claim 4 in which said electrode is a point probe, the contact area between said electrode and said body being about .0005″ to .00005″ in diameter and the thickness of said body in the region adjacent to said electrode being about .0005″ to .00005″.

8. A semi-conductor device according to claim 4 in which said electrode is fused to said body, the area of contact between said electrode and said body being about .001″ to .005″ in diameter and the thickness of said body in the region adjacent to said electrode being about .001″ to .005″.

9. A rectifying circuit element comprising a wafer of a semi-conductive material of the class including germanium and silicon, an electrode in non-rectifying contact with said body and an electrode in rectifying contact with a surface of said wafer, said material having a resistivity of about 0.1 to 1.0 ohm-cm., the average effective lifetime of minority charge carriers in said material being not more than about 0.1 microsecond, and the thickness of said wafer in the region between said electrodes being of the same order of magnitude as the diameter of the contact area between said rectifying electrode and said wafer.

10. In a point rectifier of the sharpened point and welded point type comprising a body of a semiconductive material, an electrode in non-rectifying contact with said body and a point electrode in rectifying contact with said body, the improvement whereby said body of semiconductive material has a thickness in the region between said electrodes no greater in order of magnitude than the diameter of the contact area between said rectifying electrode and said body.

References Cited in the file of this patent

UNITED STATES PATENTS

| | | |
|---|---|---|
| 2,430,028 | Pfann et al. | Nov. 4, 1947 |
| 2,600,997 | Horovitz et al. | June 17, 1952 |
| 2,703,855 | Koch et al. | Mar. 8, 1955 |
| 2,733,390 | Scanlon | Jan. 31, 1956 |
| 2,765,516 | Haegele | Oct. 9, 1956 |
| 2,776,920 | Dunlap | Jan. 8, 1957 |
| 2,781,481 | Armstrong | Feb. 12, 1957 |
| 2,783,197 | Herbert | Feb. 26, 1957 |